United States Patent
Kang (10) Patent No.: US 6,392,287 B1
(45) Date of Patent: May 21, 2002

(54) SEMICONDUCTOR PACKAGE AND FABRICATING METHOD THEREOF

(75) Inventor: In-Soo Kang, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/628,647

(22) Filed: Jul. 28, 2000

(30) Foreign Application Priority Data

Jan. 21, 2000 (KR) .......................................... 2000-2887

(51) Int. Cl.⁷ .............................................. H01L 35/10
(52) U.S. Cl. ...................... 257/669; 257/669; 257/666; 257/678; 257/690; 257/737
(58) Field of Search .................... 257/1–930; 438/1–800

(56) References Cited

U.S. PATENT DOCUMENTS

| | | | |
|---|---|---|---|
| 5,293,037 A | * 3/1994 | Le Mehaute et al. | 250/214.1 |
| 5,508,228 A | * 4/1996 | Nolan et al. | 437/183 |
| 5,956,605 A | * 9/1999 | Akram et al. | 438/613 |
| 5,994,783 A | * 11/1999 | You | 257/778 |

* cited by examiner

*Primary Examiner*—John F. Niebling
*Assistant Examiner*—Scott Geyer
(74) *Attorney, Agent, or Firm*—Birch, Stewart, Kolasch & Birch, LLP (57) ABSTRACT

The present invention relates to a semiconductor package and a fabricating method thereof, more particularly, to a chip size package of a wafer level and a fabricating method thereof. Accordingly, the present invention eases sufficiently the thermal stress generated from the difference of heat expansion rates between the semiconductor chip and the PCB substrate, increases the reliance of the wires as the stress on the wires are greatly reduced, simplifies the fabrication process, and reduces the product cost owing to simplified processes as equipments for metal deposition, metal plating and etch are not necessary. The present invention, as embodied and broadly described, the present invention includes a semiconductor chip, a chip pad in a first area of the semiconductor chip, a stress-easing layer formed in a second area of the semiconductor chip, a conductive wire connecting the chip pad to the stress-easing layer, and an electrical conductor on the conductive wire over the stress-easing layer. And, the present invention includes the steps of forming a chip pad on a first area of a semiconductor chip, forming a stress-easing layer on a second area of the semiconductor chip, forming a conductive wire connecting the chip pad to the stress-easing layer, and forming a electrical conductor on the conductive wire over the stress-easing layer.

5 Claims, 12 Drawing Sheets

SEMICONDUCTOR PACKAGE AND FABRICATING METHOD THEREOF

BACKGROUND OF THE INVENTION

1. Field of the Invention

The present invention relates to a semiconductor package and a fabricating method therefor, and more particularly, to a chip size package (hereinafter abbreviated CSP) of a wafer level and a fabricating method therefor.

2. Discussion of Related Art

Recently, chip size package (CSP) technolgies have been introduced in the art of semiconductor packaging. The CSP technologies permit elecrical connections between a semiconductor chip and a circuit boad to be contained within the area below the periphery of the chip itself, such that the package can be nearly as small as the chip.

As one of the CSP technologies, a wafer level packaging technique in which the semiconductor chips can be packaged in a wafer state without being separated into individual chips is highlighted in the art.

Conventional packaging processes of the semiconductor hcip have been carried out after the wafer is divided into respective individual chips. Contrary to that, wafer level packaging processes are completed in the wafer state before the wafer is divided into the respective individual packages.

FIG. 1A to FIG. 1E show a process of fabricating a semiconductor package according to a related art.

The drawings illustrate a chip for a single package of a wafer. Left parts of the drawings show layouts of a package, while right parts show cross-sectional views of the package schematically.

Figure 1A:
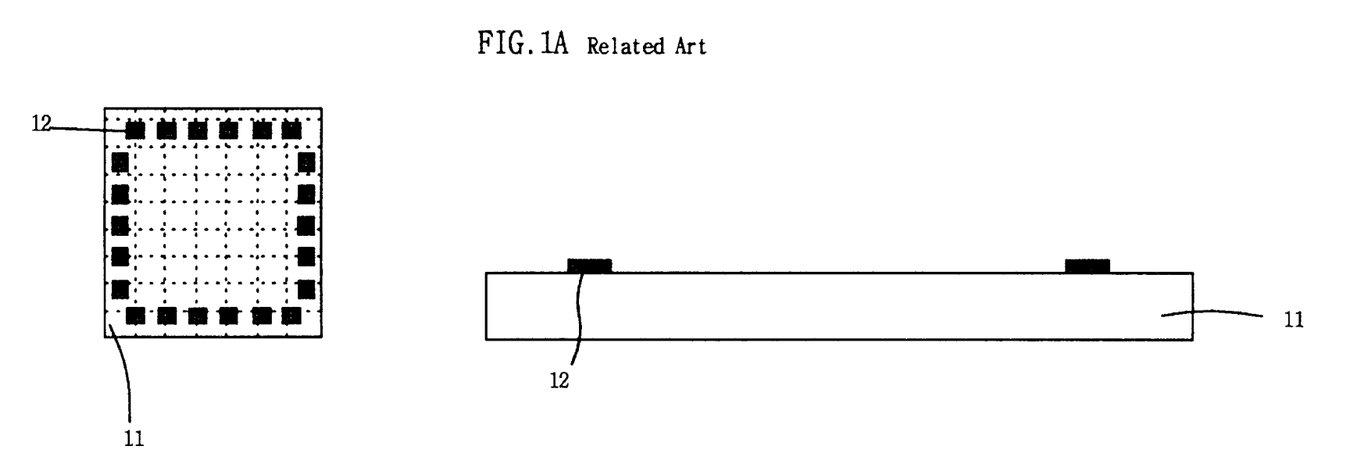
FIG. 1A to FIG. 1E show a process of fabricating a semiconductor package according to a related art.

Referring to FIG. 1A, chip pads 12 are formed on a semiconductor chip 11 on which predetermined patterns of circuit have been formed. The chip pads 12 connect the circuit of the semiconductor chip 11 to external circuits(not shown in the drawing).

Figure 1B:
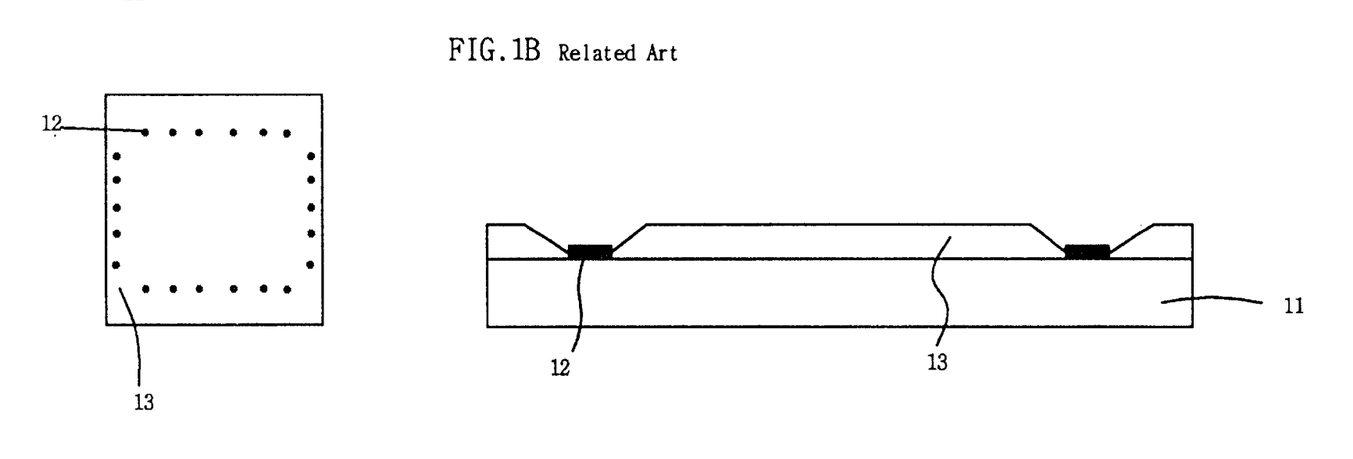

Referring to FIG. 1B, a first insulating layer 13 covering an exposed surface of the semiconductor chip 11 is formed of an insulating substance for easing stress. One of polyimide and benzo-cyclobutane(BCB) may be used for the insulating substance for easing stress.

Then, contact holes exposing portions of the chip pads 12 are formed in the first insulating layer 13.

Figure 1C:
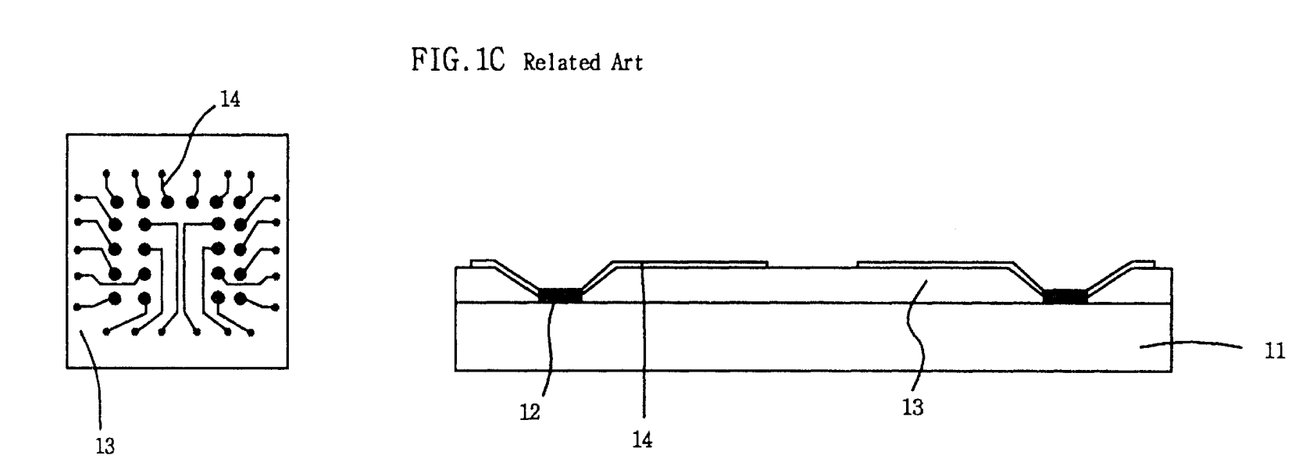

Referring to FIG. 1C, after a metal layer has been formed to cover the exposed portions of the chip pads 12 and the first insulating layer 13, a metal wiring layer 14 connected to the chip pads 12 is formed on the first insulating layer 13.

The metal wiring layer 14 usually consists of 2 to 3 layers for excellent electric conductivity between the semiconductor chip and the external circuits. Namely, after metal wiring layers of the same or different kind have been stacked, the metal wiring layer 14 is patterned by carrying out photolithography on the respective layers. Besides, an electroplated layer may be coated on the surface of the metal wiring layer 14 additionally to increase the thickness of the layer 14.

Figure 1D:
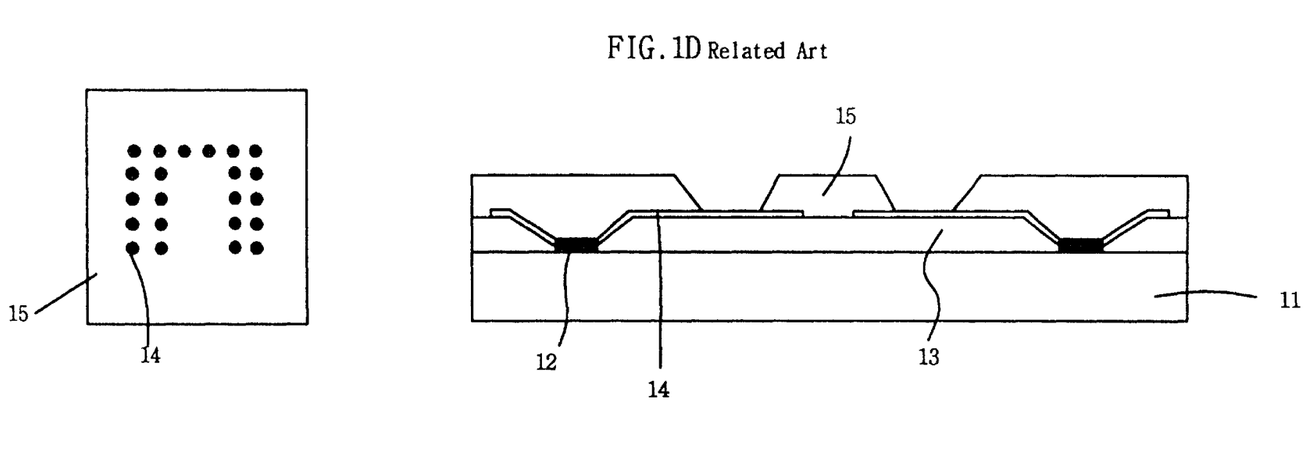

Referring to FIG. 1D, a second insulating layer 15 covering an exposed entire surface of the substrate is formed of an insulating substance to protect the metal wiring layer 14. Then, portions of the metal wiring layers 14 are exposed by forming contact holes through the second insulating layer 15.

Figure 1E:
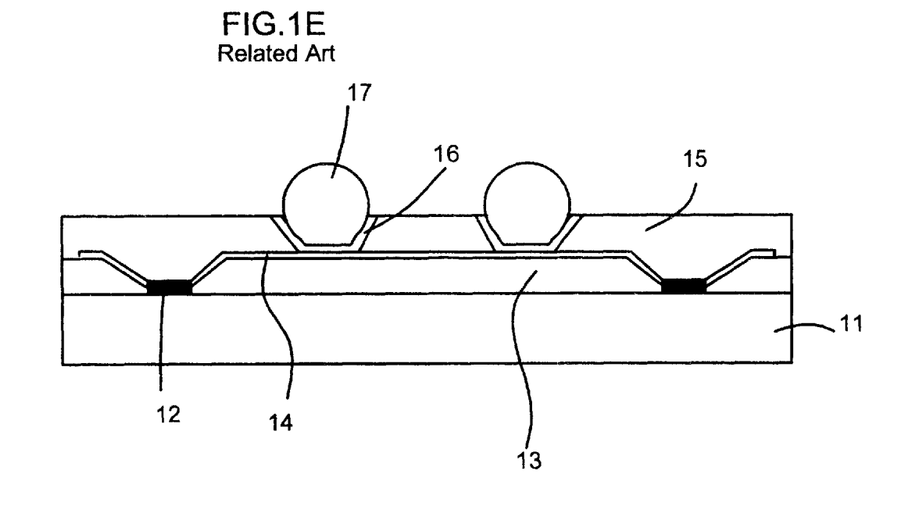

Referring to FIG. 1E, solder balls 17 connected to the exposed portions of the metal wiring layers 14 are attached thereon. In this case, as the second insulating layer 15 is used as a solder mask layer by which solder balls are attached to the metal wiring layers 14 through flux screen printing, solder ball attachment, and reflowing.

In this case, in order to enhance the attachment between the solder ball 17 and the metal wiring layer 14, an underbump metal layer 16 may be formed of a substance of which attachment capacity is very high therebetween.

Then, the fabrication of a semiconductor package is completed after following steps such as dicing, etc. have been carried out.

Figure 2:
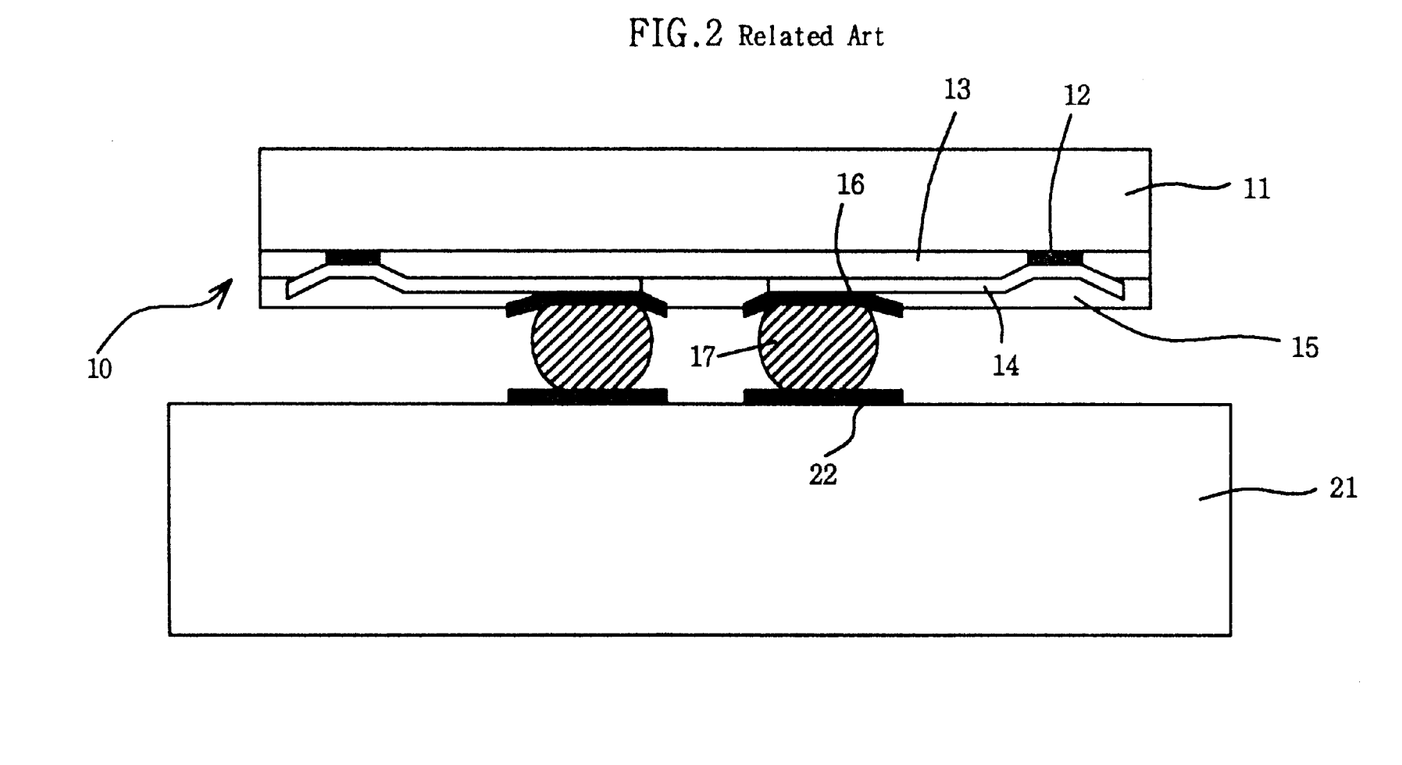
FIG. 2 shows a case of mounting a semiconductor package produced by the above-mentioned fabricating process on a printed circuit board.

FIG. 2 shows a case of mounting a semiconductor package produced by the above-mentioned fabricating process on a printed circuit board(hereinafter abbreviated PCB).

Referring to FIG. 2, metal wiring layers 14 are connected to chip pads 12 on a semiconductor chip 11. A semiconductor package 10 of which solder balls 17 are connected to the metal wiring layers 14 is contacted with PCB pads 22 of a PCB substrate 21. That is, the semiconductor package 10 is mounted on the PCB substrate 21 while the solder balls 17 are connected to the PCB pads 22.

Unfortunately, reliability of a metal wire is very poor in the semiconductor package structure of the related art. While devices constructing the semiconductor chip are working, heat expansion between the PCB substrate and the semiconductor chip occurs due to resistance heat generated from the devices.

During this reaction, stress is concentrated on the solder balls connecting the PCB substrate and the semiconductor chip which produce the difference of heat expansion rate. Therefore, break-down of metal wire appears as the peripheral metal substances such as metal wiring layers, underbump metal layers near the solder ball attached parts experience fatigue due to heat stress.

In the semiconductor package according to the related art, heat expansion rates of the chip pads of the semiconductor chip and the solder mask layer of the second insulating layer result in a great difference. Such difference in heat expansion rates between the chip pads and the solder mask layer causes the concentration of heat stress on the metal wiring layers lying therebetween, more particularly, on the portions of the metal wiring layers on the chip pads. Thereby, poor results such as breakdown and stripping of the metal wires on the chip pads occur.

Moreover, as the semiconductor package is fabricated through various steps of forming a first insulating layer for casing stress, forming multi-stacked metal wiring layers in use of sputtering apparatus, increasing the thickness of metal wiring layers, and etching respective metal layers in use of respective etchants, yield of the fabrication method of the semiconductor package is reduced due to the complicated steps of fabrication according to the related art.

SUMMARY OF THE INVENTION

Accordingly, the present invention is directed to a semiconductor package and a fabricating method thereof that substantially obviate one or more of the problems due to limitations and disadvantages of the related art.

The object of the present invention is to provide a semiconductor package and a fabricating method thereof which prevent the damages of metal wires in the related art from being generated by using both low-elastic stress-easing substances and polymer substances having electric conductivity.

Another object of the present invention is to provide a semiconductor package and a fabricating method thereof which simplify the fabrication steps by introducing the improved structure which is resulted from low-elastic stress-easing substances and polymer substances.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a semiconductor chip, a chip pad in a first area of the semiconductor chip, a stress-casing layer formed in a second area of the semiconductor chip, a conductive wire connecting the chip pad to the stress-easing layer, and an electrical conductor on the conductive wire over the stress-easing layer.

In another aspect, the present invention includes the steps of forming a chip pad on a first area of a semiconductor chip, forming a stress-easing layer on a second area of the semiconductor chip, forming a conductive wire connecting the chip pad to the stress-easing layer, and forming an electrical conductor on the conductive wire over the stress-easing layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF PREFERRED EMBODIMENTS

Reference will now be made in detail to the preferred embodiments of the present invention, examples of which are illustrated in the accompanying drawings.

The present invention prevents the damages of metal wires in the related art from being generated by using both low-elastic stress-casing substances and polymer substances having electric conductivity. And, the present invention simplifies the fabrication steps by introducing the improved structure which is resulted from low-elastic stress-casing substances and polymer substances.

Figure 3:
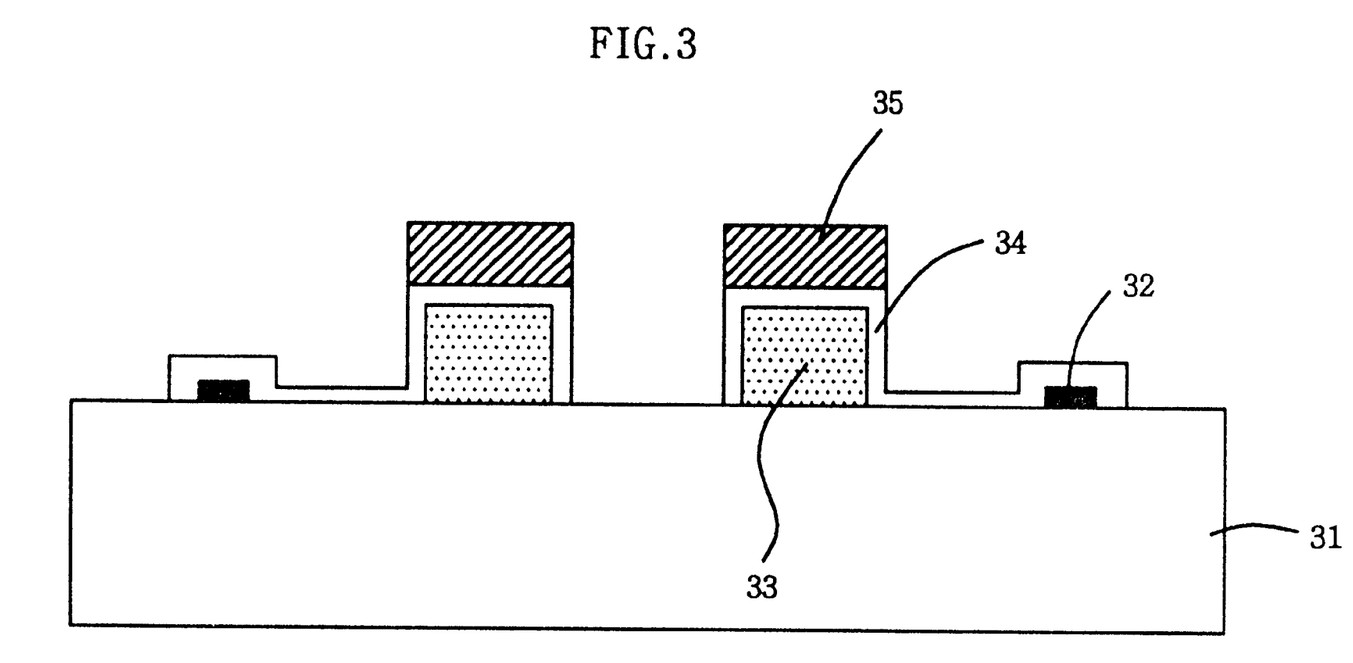
FIG. 3 shows a schematic cross-sectional view of a semiconductor package according to a first embodiment of the present invention.

FIG. 3 shows a schematic cross-sectional view of a semiconductor package according to a first embodiment of the present invention.

Referring to FIG. 3, chip pads 32 are formed in a first area on a predetermined portion of a semiconductor chip 31, while a stress-easing layer 33 thicker than the chip pads 32 is formed in a second area on another predetermined portion of the semiconductor chip 31. The stress-easing layer 33 made of a polymer substance of which elastic coefficient is low absorbs the stress.

Conductive wires 34 are formed to cover the stress-easing layer 33 as well as connected to the chip pads 32. The conductive wires 34 are made of electrically-conductive polymer substances.

Bumps 35 made of low-elastic electrically-conductive polymers are formed on the conductive wires 34 over the stress-easing layer 33 for releasing the stress.

The structural merits of the semiconductor package of the present invention is 41 explained in the following description by referring to FIG. 4.

Figure 4:
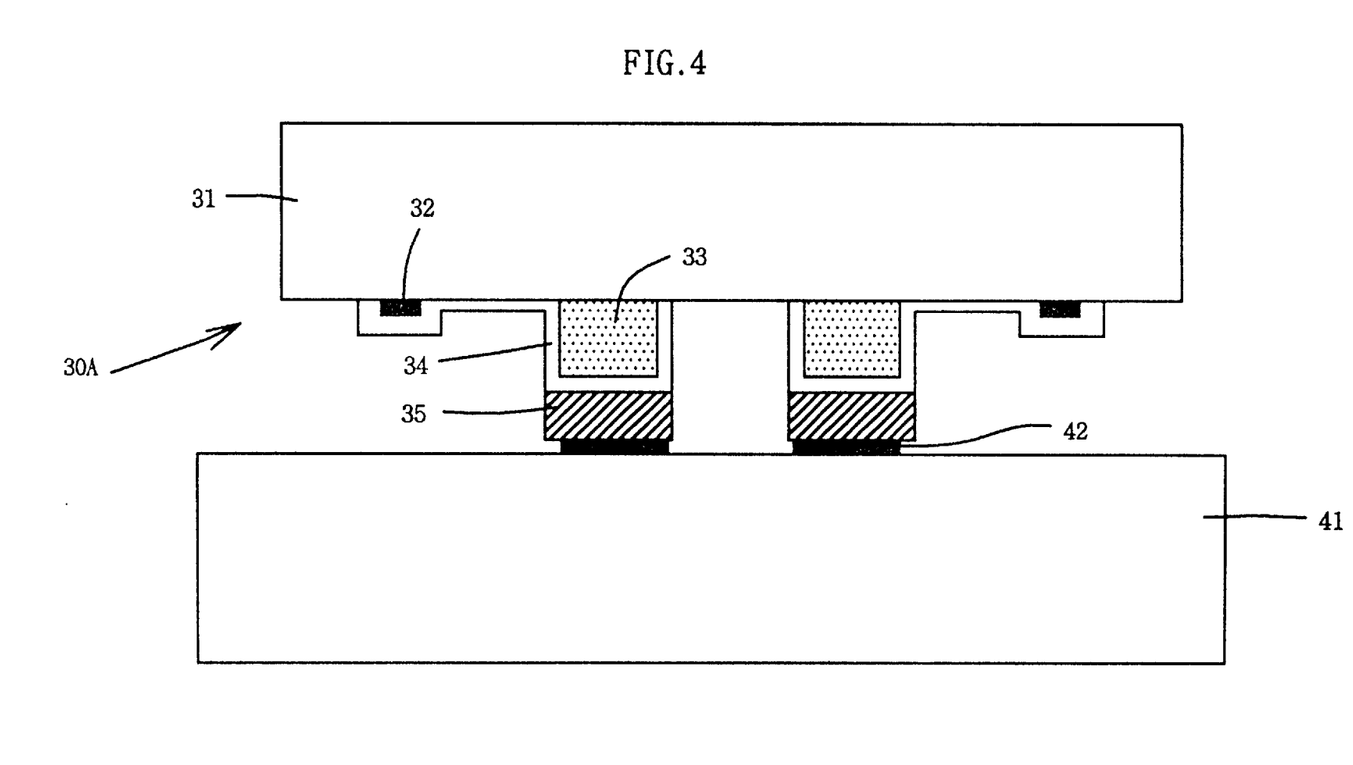
FIG. 4 shows a cross-sectional view of mounting the semiconductor package shown in FIG. 3 on a PCB substrate.

FIG. 4 shows a cross-sectional view of mounting the semiconductor package shown in FIG. 3 on a PCB substrate.

Referring to FIG. 4, a semiconductor package 30A is mounted on a PCB substrate 41. The semiconductor package 30A includes chip pads 32 formed in a first area on a predetermined portion of a semiconductor chip 31, a stress-easing layer 33 thicker than the chip pads 32 and formed in a second area on another predetermined portion of the semiconductor chip 31, conductive wires 34 formed to cover the stress-easing layer 33 as well as connected to the chip pads 32 and made of electrically-conductive polymer substances, and bumps 35 made of low-elastic electrically-conductive polymers formed on the conductive wires 34 over the stress-easing layer 33.

The semiconductor package 30A, of which bumps 35 made of low-elastic electrically-conductive polymers are contacted and connected to the PCB pads 42 of the PCB substrate 41, is mounted on the PCB substrate 41.

Under the above circumstances, while devices constructing the semiconductor chip are being operated, the PCB substrate 41 and the semiconductor chip 31 experience thermal expansion owing to resistance heat generated from the devices. In this case, stress of thermal expansion, which is generated from the difference of thermal expansion rates of the PCB substrate 41 and the semiconductor chip 31, is concentrated on the bumps 35 and stress-easing layer 33 which connect the PCB substrate 41 to the semiconductor chip 31.

Yet, the bumps 35 and stress-easing layer 33, which are made of low-elastic polymer it substances, release the stress due to the difference of thermal expansion rates of the 42 semiconductor chip 31 and the PCB substrate 41 by absorbing the stress.

Therefore, the poor results of wires of the related art are prevented by the present invention.

Moreover, the present invention increases the reliance of the wires by reducing the stress on the wires as the area occupied by the insulating layer beneath the conductive wires 34 is greatly reduced and the wires are formed of electrically-conductive polymer substances instead of metal substances which may cause breakdown of wires due to fatigue.

As mentioned in the above description of the present invention, the low-elastic stress-easing layer which is patterned to leave a portion to which the bumps will be attached is rearranged in use of general electrically-conductive polymer substances instead of using metal wires.

FIG. 5A to FIG. 5D show cross-sectional views of fabricating the semiconductor package shown in FIG. 3.

The drawings illustrate a chip for a single package of a wafer. Left parts of the drawings show layouts of a package, while right parts show cross-sectional views of the package schematically.

Figure 5A:
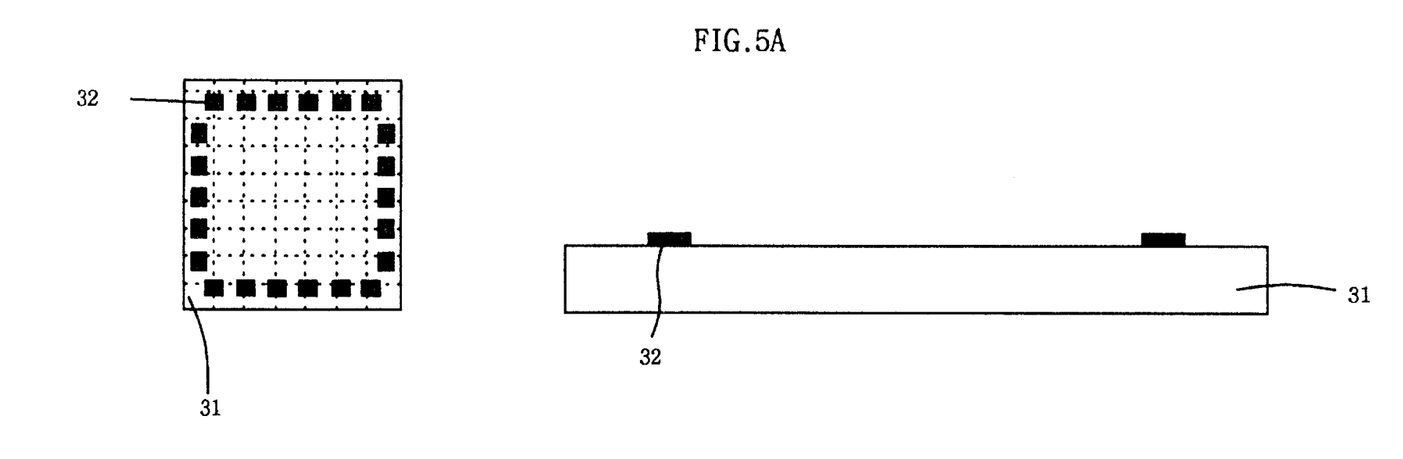
FIG. 5A to FIG. 5D show cross-sectional views of fabricating the semiconductor package shown in FIG. 3.

Referring to FIG. 5A, chip pads 32 are formed on a semiconductor chip 31 on which predetermined patterns of circuit have been formed. The chip pads 32 connect the circuit of the semiconductor chip 31 to external circuits(not shown in the drawing).

Figure 5B:
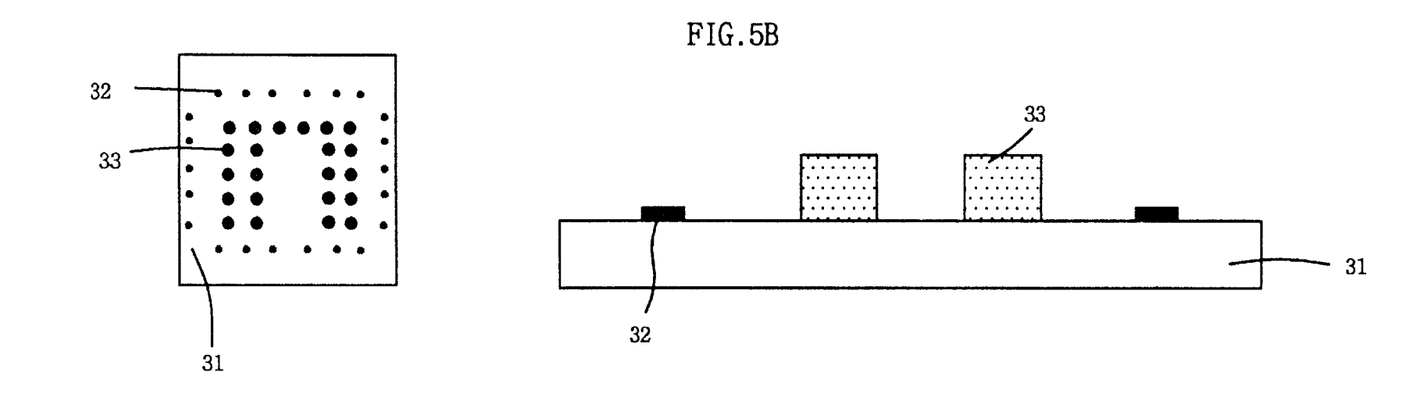

Referring to FIG. 5B, a stress-easing layer 33 is formed on a predetermined portion of the semiconductor chip 31 by coating an exposed surface of the semiconductor substrate 31 with a low-elastic insulating polymer substance then by carrying out photolithography. Thickness of the stress-easing layer 33 depends on the distance between a semiconductor package to be fabricated and a PCB substrate on which the package will be mounted.

In this case, one of epoxy groups, silicone groups or polyimide groups may be used for forming the stress-easing layer 33 of low-elastic polymer substances.

Figure 5C:
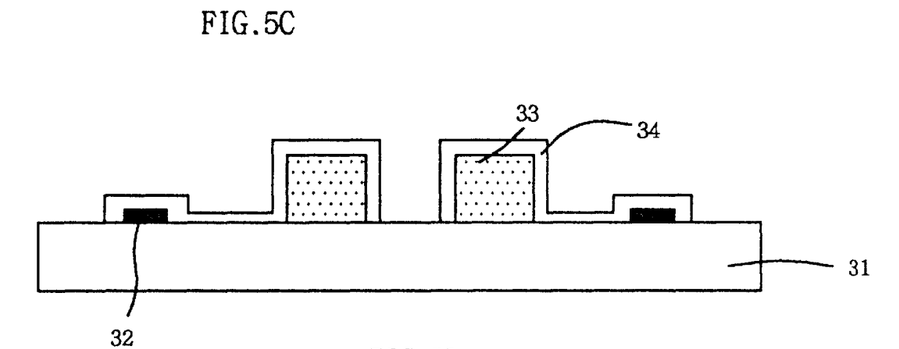

Referring to FIG. 5C, after a layer of low-elastic electrically conductive polymer substance has been formed on the surface of the substrate, conductive wires 34 connecting the chip pads 31 to the stress-casing layer 33 are formed by photolithography. In this case, for the purpose of wire reliability, the conductive wires are formed enough to cover the stress-easing layer 33.

Besides, another substance of which electric conductivity is excellent such as Ag may be added to the low-elastic electrically conductive polymer substances for forming the conductive wires 34 such as epoxy group or silicone group.

Figure 5D:
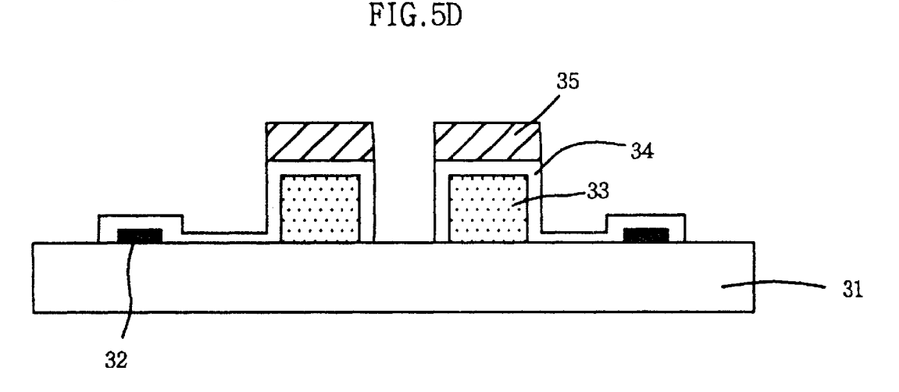

Referring to FIG. 5D, bumps 35 are formed on the conductive wires 34 over the stress-easing layer 33 in use of low-elastic electrically-conductive polymer substances. In this case, the step of forming the bumps 35 with the low-elastic electrically-conductive substances may be carried out by screen printing or by conventional coating and photolithography. Thickness of the bump 35 may be controlled by both thicknesses of the stress-casing layer 33 and the conductive wire 34.

Another substance of which electric conductivity is excellent, such as Ag, may be added to the low-elastic electrically conductive polymer substances for forming the conductive wires 34 such as epoxy group or silicone group to form the bumps 35.

Then, following steps such as dicing, etc. are carried out to complete the fabrication of the semiconductor package.

As mentioned in the above description of the present invention, the conductive wires are formed by patterning the coated electrically-conductive polymer substances successively.

Moreover, the present invention needs no formation of an insulating layer for protecting the conductive wires.

On the contrary, in the related art, two or three metal layers are formed for metal wires. The metal layers are formed by using a sputtering apparatus, and increased in thickness by using an electroplating method.

And, the metal layers are etched by different kinds of etchants in accordance with the species of the metal wires.

Moreover, insulating layers are formed onto and beneath the metal wires to be protected from corrosion and the like.

Accordingly, compared to the related art, the present invention simplifies the steps of fabrication and reduces the product cost owing to simplified processes as equipments for metal deposition, metal plating and etch are not necessary.

Figure 6:
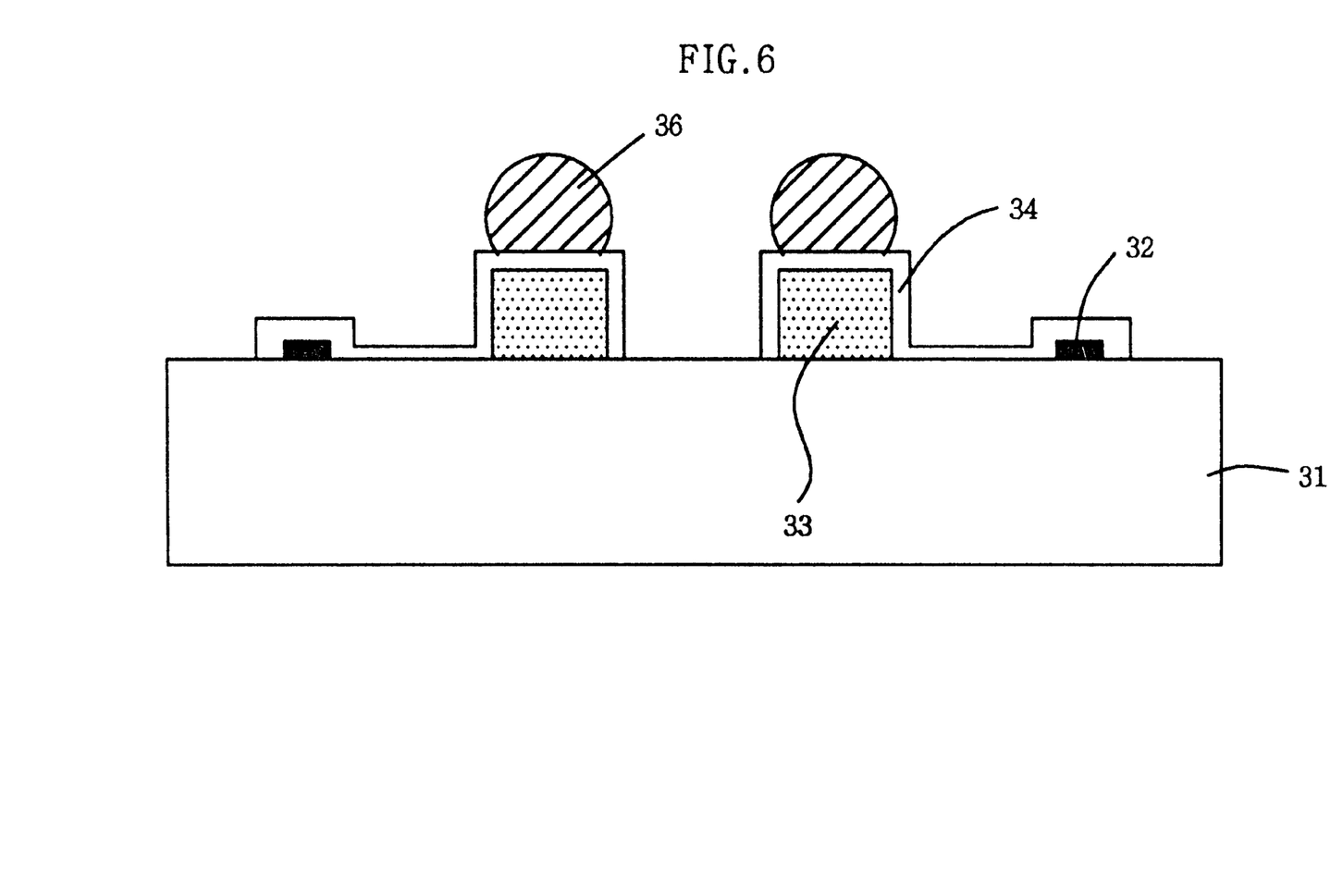
FIG. 6 shows a schematic cross-sectional view of a semiconductor package according to a second embodiment of the present invention.
Figure 7:
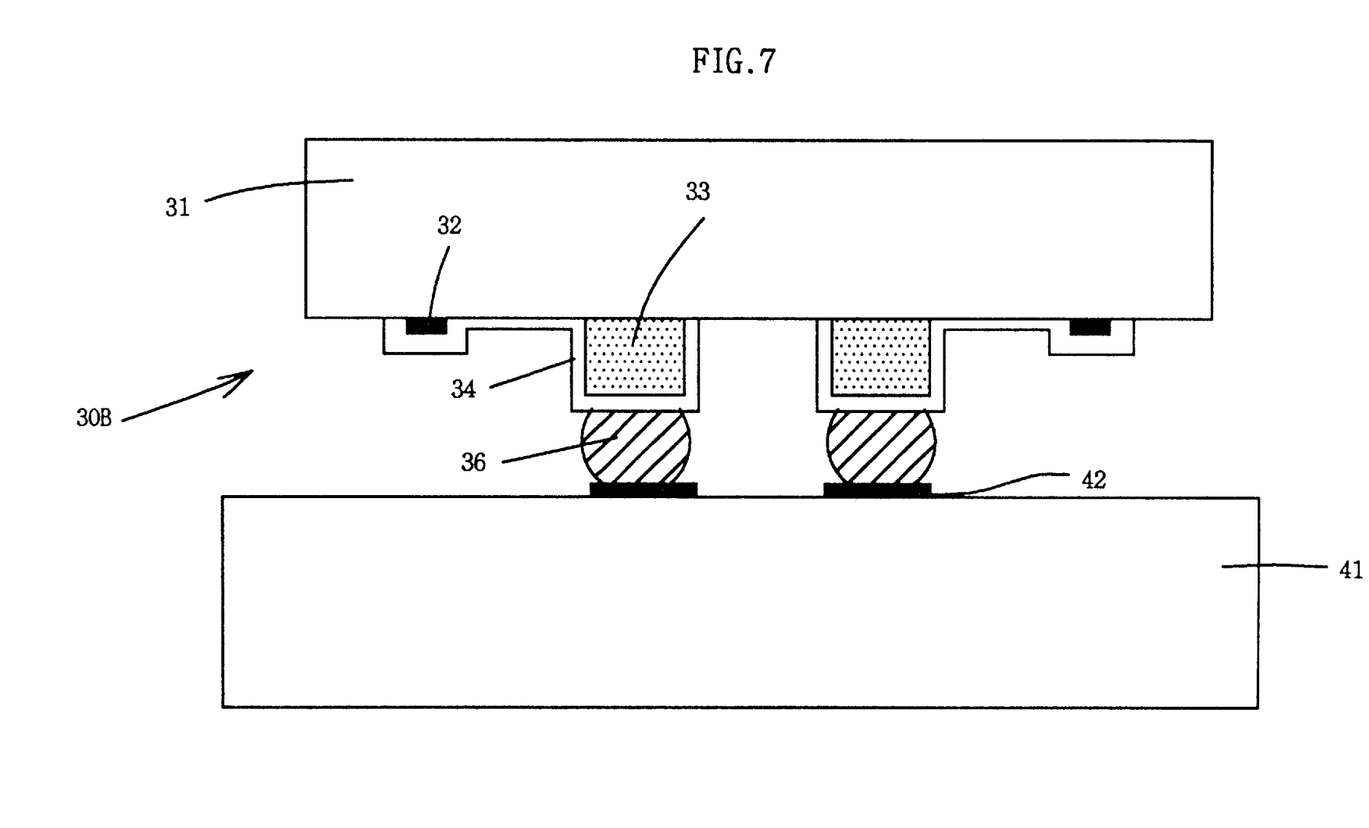
FIG. 7 shows a cross-sectional view of mounting the semiconductor package shown in FIG. 6 on a PCB substrate.

FIG. 6 shows a schematic cross-sectional view of a semiconductor package according to a second embodiment of the present invention, and FIG. 7 shows a cross-sectional view of a mounting the semiconductor package shown in FIG. 6 on a PCB substrate.

Referring to FIG. 6, chip pads 32 are formed in a first area on a predetermined portion of a semiconductor chip 31, while a stress-casing layer 33 thicker than the chip pads 32 is formed in a second area on another predetermined portion of the semiconductor chip 31. The stress-casing layer 33, as mentioned in the above description, made of a polymer substance of which elastic coefficient is low absorbs the stress.

And, conductive wires 34 are formed to cover the stress-easing layer 33 as well as connected to the chip pads 32. The conductive wires 34, as mentioned in the above description, are made of electrically-conductive polymer substances.

Solder balls 36 are formed on the conductive wires 33 over the stress-easing layer 34 for releasing the stress.

Compared to the first embodiment of the present invention in which the bumps 35 are made of low-elastic electrically-conductive substances for the semiconductor package, the second embodiment of the present invention forms the solder balls 36 for the semiconductor package.

Referring to FIG. 7, a semiconductor package 30B is mounted on a PCB substrate 41 wherein the solder balls 36 are contacted and connected to the PCB pads 42 of the PCB substrate 41.

As is the case with the semiconductor package 30A according the first embodiment of the present invention, the semiconductor package 30B according to the second embodiment of the present invention eases the thermal stress generated from the difference of heat expansion rates between the semiconductor chip 31 and the PCB substrate 41, which is resulted by the existence of the stress-easing layer 33 made of the low-elastic polymer substance.

Moreover, in the semiconductor package of the present invention, the size of the insulating layer beneath the conductive wires is reduced greatly and the conductive wires are formed of electrically-conductive substances instead of using metal substances which may cause the breakdown of the wires due to fatigue.

The steps of fabricating the semiconductor package according to the second embodiment of the present invention are very similar to those of the first embodiment of the present invention.

As shown in FIG. 5A to FIG. 5C, chip pads 32 are formed on a semiconductor chip 31, a stress-easing layer 33 is formed, conductive wires 34 are formed, then, solder balls 36 are formed on the conductive wires 34.

The second embodiment of the present invention only differs from the first embodiment of the present invention in that the solder balls 36 are introduced instead of forming the bumps with low-elastic polymers. The solder balls 36 arc attached to the conductive wires 34 by a conventional method of solder ball attachment such as ball attachment & reflowing.

Then, following steps such as dicing, etc. are carried out to complete the fabrication of the semiconductor package.

Figure 8:
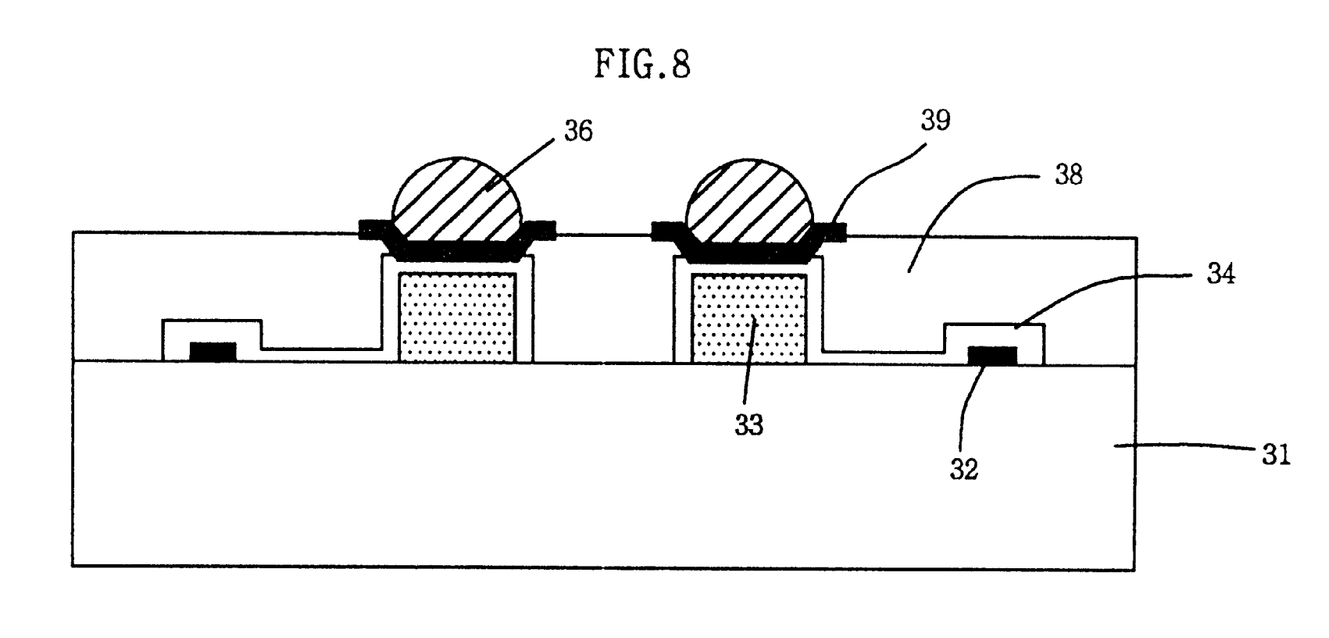
FIG. 8 shows a schematic cross-sectional view of a semiconductor package according to a third embodiment of the present invention.
Figure 9:
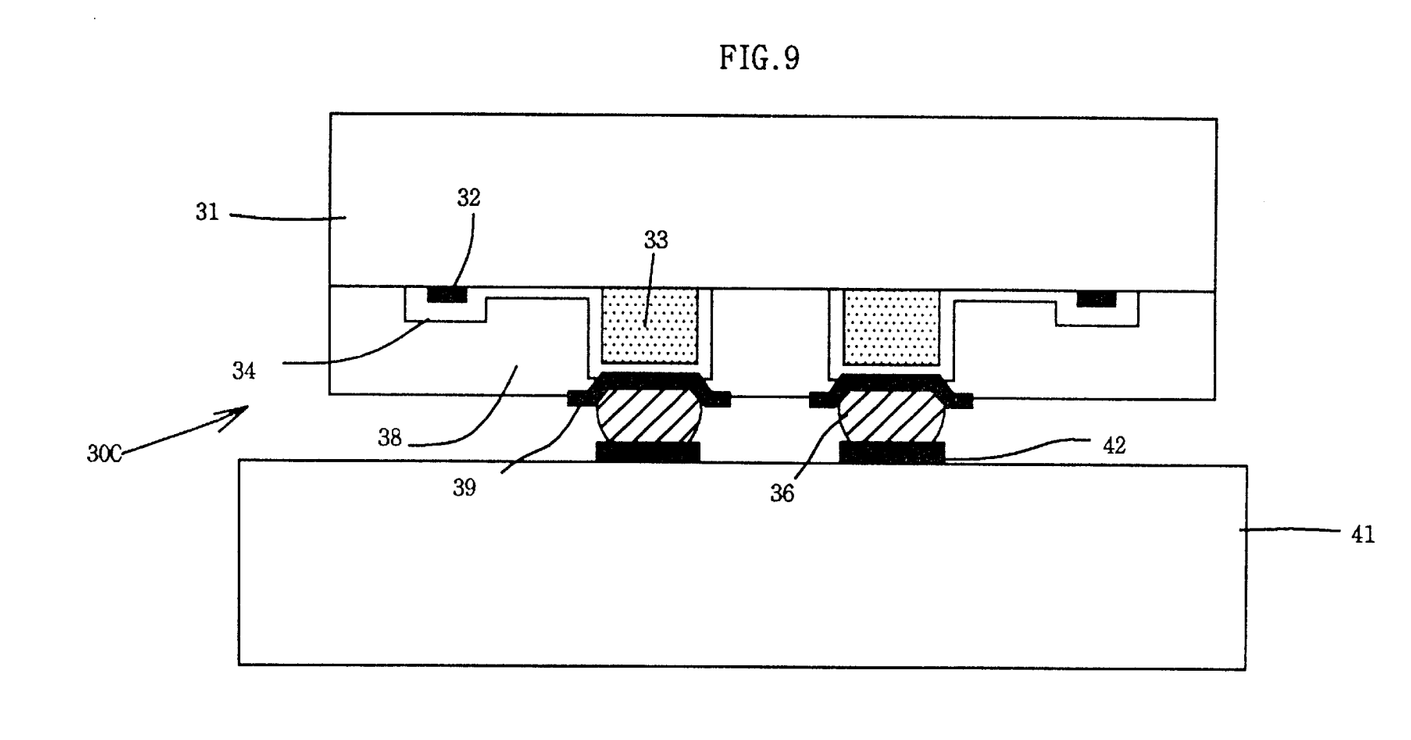
FIG. 9 shows a cross-sectional view of mounting the semiconductor package shown to in FIG. 8 on a PCB substrate.

FIG. 8 shows a schematic cross-sectional view of a semiconductor package according to a third embodiment of the present invention, and FIG. 9 shows a cross-sectional view of mounting the semiconductor package shown in FIG. 8 on a PCB substrate.

Referring to FIG. 8, chip pads 32 are formed in a first area on a predetermined portion of a semiconductor chip 31, while a stress-casing layer 33 thicker than the chip pads 32 is formed in a second area on another predetermined portion of the semiconductor chip 31. The stress-easing layer 33, as mentioned in the above description, made of a polymer substance of which elastic coefficient is low absorbs the stress.

Conductive wires 34 are formed to cover the stress-easing layer 33 as well as connected to the chip pads 32. The conductive wires 34, as mentioned in the above description, are made of electrically-conductive polymer substances.

Besides, a solder mask layer 38 covers the entire surface except the conductive wires 34 over the stress-easing layer 33, while an under-bump metal layers 39 are formed on the exposed portions of the conductive wires 34 which are not covered with the solder mask layer 38.

And, solder balls 36 are formed on the under-bump metal layers 39.

Compared to the second embodiment of the present invention, the third embodiment of the present invention forms the under-bump metal layers 39 beneath the solder balls 36 to increase the intensity of solder attachment for the semiconductor package. In this case, the solder mask layer 38 makes the formation of the under-bump metal layers 39.

Referring to FIG. 9, a semiconductor package 30C is mounted on a PCB substrate 41 wherein the solder balls 36 of the semiconductor package according to the third embodiment of the present invention are contacted and connected to the PCB pads 42 of the PCB substrate 41.

As is the case with the semiconductor package 30A according the first embodiment of the present invention, the semiconductor package 30C according to the third embodiment of the present invention cases the thermal stress generated from the difference of heat expansion rates between the semiconductor chip 31 and the PCB substrate 41, which is resulted by the existence of the stress-easing layer 33 made of the low-elastic polymer substance.

Moreover, in the semiconductor package of the present invention, the size of the insulating layer beneath the conductive wires is reduced greatly and the conductive wires are formed of electrically-conductive substances instead of using metal substances which may cause the breakdown of the wires due to fatigue. Thereby, the reliance of the wires are increased as the stress on the wires are greatly reduced.

The steps of fabricating the semiconductor package according to the third embodiment of the present invention are very similar to those of the first embodiment of the present invention.

As shown in FIG. 5A to FIG. 5C, chip pads 32 are formed on a semiconductor chip 31, a stress-easing layer 33 is formed, and conductive wires 34 are formed.

After a solder mask layer 38 has been formed of insulator to cover the entire surface of the substrate, portions of the conductive wires 34 over the stress-easing layer 33 are exposed by etching the solder mask layer 38 by photolithography.

After under-bump metal layers 39 have been formed to cover the exposed portions of the conductive wires 34, solder balls 36 are attached to the under-bump metal layers 39.

Then, following steps such as dicing, etc. are carried out to complete the fabrication of the semiconductor package.

As mentioned in the above description of the present invention, the low-elastic stress-easing layer which is patterned to leave a portion to which the bumps will be attached is rearranged in use of general electrically-conductive polymer substances instead of using metal wires.

Accordingly, the semiconductor package according to the present invention eases sufficiently the thermal stress generated from the difference of heat expansion rates between the semiconductor chip and the PCB substrate by forming a stress-easing layer made of the low-elastic polymer substance and by introducing the structure that the size of an insulating layer under the conductive wires is greatly reduced.

In the semiconductor package of the present invention, the conductive wires are formed of electrically-conductive substances instead of using metal substances which may cause the breakdown of the wires due to fatigue, thereby increasing the reliance of the wires as the stress on the wires are greatly reduced.

Moreover, the present invention forms the conductive wires by patterning the coated electrically-conductive polymer substances successively as well as needs no formation of an insulating layer for protecting the conductive wires, thereby simplifying the fabrication process.

Besides, compared to the related art, the present invention simplifies the steps of fabrication and reduces the product cost owing to simplified processes as equipments for metal deposition, metal plating and etch are not necessary.

It will be apparent to those skilled in the art that various modifications and variations can be made in a semiconductor package and a fabricating method thereof of the present invention without departing from the spirit or scope of the inventions. Thus, it is intended that the present invention cover the modifications and variations of this invention provided they come within the scope of the appended claims and equivalents.

What is claimed is:

1. A semiconductor package comprising:
    a semiconductor chip;
    a chip pad in a first area of the semiconductor chip;
    a stress-easing layer formed in a second area of the semiconductor chip;
    a conductive wire connecting the chip pad to the stress-easing layer, said conductive wire being formed to cover the stress-easing layer; and
    an electrical conductor disposed on the conductive wire over the stress-easing layer.

2. The semiconductor package according to claim 1, wherein the electrical to conductor is a bump or a solder ball made of a low-elastic electrically-conductive polymer substance.

3. The semiconductor package according to claim 1, wherein the stress-easing layer is made of a low-elastic polymer substance.

4. The semiconductor package according to claim 1, wherein the conductive wire is made of an electrically-conductive polymer substance.

5. The semiconductor package according to claim 2, wherein the semiconductor package further comprises:
    an under-bump metal layer inserted between the solder ball and the conductive wire; and
    a solder mask layer covering an entire surface of the conductive wire except for a portion over the under-bump metal layer.

* * * * *